United States Patent [19]

Riermeier et al.

[11] Patent Number: 5,290,366

[45] Date of Patent: Mar. 1, 1994

[54] LAMINATED SOLAR MODULE

[75] Inventors: Manfred Riermeier, Oberneuching; Klaus Bednorz, Munich, both of Fed. Rep. of Germany

[73] Assignee: Siemens Solar GmH, Bergisch-Gladbach, Fed. Rep. of Germany

[21] Appl. No.: 32,470

[22] Filed: Mar. 16, 1993

Related U.S. Application Data

[63] Continuation-in-part of Ser. No. 908,904, Jul. 2, 1992, abandoned, which is a continuation of Ser. No. 658,014, Feb. 20, 1991, abandoned.

[30] Foreign Application Priority Data

Mar. 8, 1990 [DE] Fed. Rep. of Germany ....... 4007376

[51] Int. Cl.$^5$ ................. H01L 31/048; H01L 31/05
[52] U.S. Cl. ................................... 136/244; 136/251
[58] Field of Search ............................ 136/244, 251

[56] References Cited

U.S. PATENT DOCUMENTS

| 4,167,644 | 9/1979 | Kurth et al. | 136/251 |
| 4,233,085 | 11/1980 | Roderick et al. | 136/244 |
| 4,636,577 | 1/1987 | Peterpaul | 136/206 |
| 5,022,930 | 6/1991 | Ackerman et al. | 136/251 |

FOREIGN PATENT DOCUMENTS 3105352  9/1982  Fed. Rep. of Germany ...... 136/244

Primary Examiner—Aaron Weisstuch
Attorney, Agent, or Firm—Hill, Steadman & Simpson

[57] ABSTRACT

A laminated solar module has two spatially-separated electrical terminals with a simple cabling of a plurality of such solar modules to one another. The solar modules are weather proof. A respective housing is located at each electrical terminal. A protective diode is integrated in at least one housing as a normally-non-conducting diode bridging solar cells that are arranged in the solar module and connected in series.

4 Claims, 2 Drawing Sheets

LAMINATED SOLAR MODULE

This is a continuation of application Ser. No. 07/908,904, filed Jul. 2, 1992 now abandoned which is a continuation of Ser. No. 658,014 filed Feb. 20, 1991 now abandoned.

BACKGROUND OF THE INVENTION

1. Field of the Invention

The pertinent invention relates to a laminated solar module having two spatially-separated electrical terminals.

2. Description of the Prior Art

A laminated solar module is a solar generator whose solar cells with appertaining electrical terminals and connecting lines are embedded in a composite composed of a carrier or rear side covering, elastic hot-melt adhesive foils, and a glass panel. A glass panel, sheet metal, a foil or the like may be used as the carrier or rear side covering. Hardened glass panes may be used as glass panels, these making it possible to achieve a reduction in the thickness of the generator and in its weight. The solar cells and hot-melt adhesive foils are placed between the carrier and the glass panel. The hot-melt adhesive foils are placed between the carrier and the glass panel. The hot-melt adhesive foils and the solar cells are fused to the carrier and the glass panel by a thermal vacuum process to form a composite. After they melt, the hot-melt adhesive foils form practically a single layer. Flint glass may also be used as the glass material, having practically no absorption in the range of light for which solar cells are particularly sensitive. A transparent foil can also be employed instead of the glass panel.

SUMMARY OF THE INVENTION

A large-scale solar module should have a power output in the kilowatt range or even greater. To this end, a plurality of laminated, frameless solar modules can be mounted on a common mounting frame and can be electrically interconnected with one another. The development of a new technology is required for the manufacture of such a large-scale solar module.

Connecting the individual, laminated solar modules to one another should be simple and cost-effective and the connections should also be weather-proof. The expense for the connecting of the individual, laminated solar modules to one another should be minimized and should enable the formation of a large-scale solar module in a simple manner.

The device is provided with connections such that the individual, laminated solar modules do not flap in the wind, even without additional fastening, and is protected and insulated from moisture in order to prevent corrosion. The device used for connecting the individual, laminated solar modules should also enable a simple manufacture of the laminated solar modules.

The above objects are achieved, according to the present invention, by the provision of a laminated solar module having two spatially-separated electrical terminals and having a respective housing at each electrical terminal, whereby a protective diode is integrated in at least one housing. The protective diode, which is a normally non-conducting diode, bridges solar cells that are arranged in the solar module and are connected in series.

According to a particular development and feature of the invention, the solar module described above is particularly characterized by plugs as electrical terminals at the edge of the solar module, so that two solar modules in direct proximity to one another can be electrically connected to one another via these plugs.

According to another development and feature of the invention, the solar module is characterized by an integrated connecting conductor at each of the electrical terminals.

According to another development and feature of the invention, the solar module is characterized in that the housings are filled with silicone.

According to another development and feature of the invention, a large-scale solar module comprising a plurality of solar modules as set forth above is characterized in that a plurality of solar modules are connected in series, and in that the conductors of such cells are connected together to form a series arrangement.

According to another development and feature of the invention, a large-scale solar module as mentioned above is particularly characterized in that the connectors are protected against moisture with shrink fit tubes.

According to another feature and development of the invention, a large-scale solar module as described above and having a plurality of solar modules is characterized in that a plurality of solar modules are connected in series and are directly electrically connected to one another via electrical plugs.

The present invention provides a laminated, frameless solar module for series connection in a large-scale solar module. No involved connection box on the laminated solar modules is required in practicing the present invention.

According to the invention, the electrical terminals can be directly extended out of the solar module in the form of a short connecting conductor or in the form of a plug.

In accordance with one development, the invention makes it possible for the laminated solar modules to be directly and immediately plugged to one another.

BRIEF DESCRIPTION OF THE DRAWINGS

Other objects, features and advantages of the invention, its organization, construction and operation will be best understood from the following detailed description, taken in conjunction with the accompanying drawings, in which.

DESCRIPTION OF THE PREFERRED EMBODIMENTS

Figure 1:
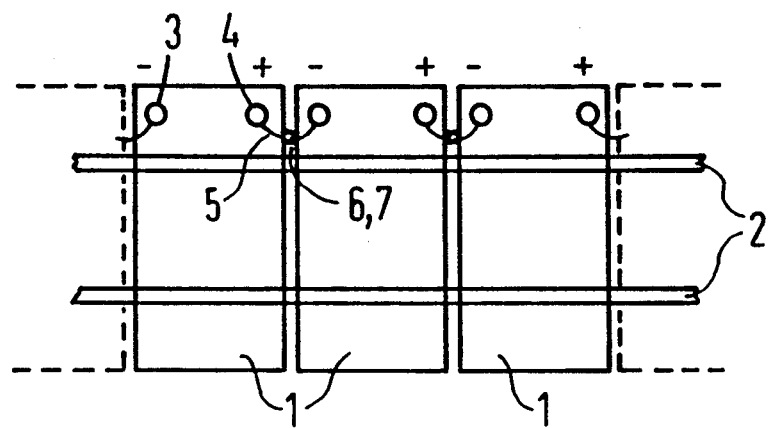
FIG. 1 is a plan view showing the inner connection of a plurality of laminated solar modules

FIG. 1 illustrates the inner connection of a plurality of laminated, frameless solar modules 1 that are mounted on a common mounting frame 2 to form a large-scale solar module and which are electrically connected in series with one another. Each laminated solar module 1 has an electrical terminal 3 as a negative pole and an electrical terminal 4 as a positive pole. The electrical terminals 3 and 4 are arranged such that they are spatially separated at each solar module and have a far-greater spacing from one another within an individual solar module than each electrical terminal has from the edge of the solar module that lies nearest thereto. Within a solar module 1, a respective one of the electrical terminals 3, 4 is thereby closer to one of the two opposite edges of the solar module than to the other electrical terminal.

In the exemplary embodiment of FIG. 1, the solar modules 1, at each electrical terminal 3 and 4, have a short, single-pole connection conductor 5 of material that is ultraviolet (UV) and weather resistant, this being conducted directly out of the solar module 1. The connections provide for the series connection of the solar modules 1 by way of connectors 6, for example, made by the AMP Company. For example, the AMP Plasti-Crimp Insulating Bushes (parallel connectors) are suitable for these cable connectors 6, these being crimped and covered with a shrink fit tube 7. For example, such a shrink fit tube 7 can be a heat-shrinkable tube ATUM black ¼ of the Raychem Company.

FIG. 1 is a view of the rear side of the solar modules 1.

Figure 2:
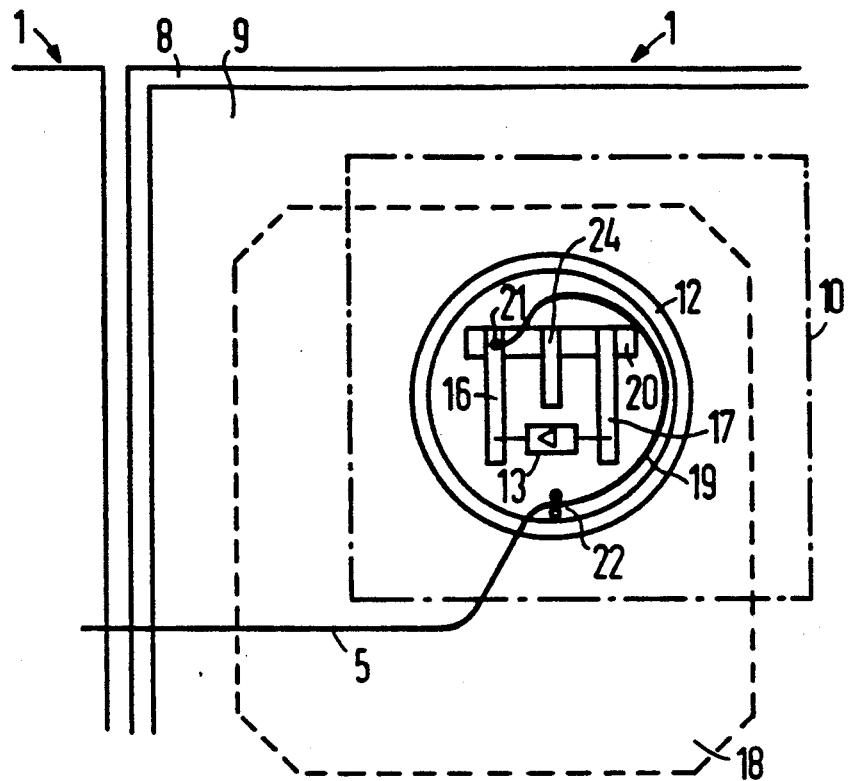
FIG. 2 is a plan view of a solar module further illustrating the electrical terminals and connection.

FIG. 2 is a planar illustration of the rear side of the solar module 1 in the region of one of the electrical terminals 3 and 4. The solar module 1 has a glass panel 8 that can have a thickness in the range of a few millimeters. A layer structure 15 (FIG. 3) that comprises a hot-melt adhesive foil 9 and a rear side covering 10 is connected to the glass panel 8. The hot-melt adhesive foil 9 can be an EVA foil. The rear side covering 10 can be a white Tedlar foil. The connecting lines for the electrical connection of the solar cells to one another (not visible in FIG. 3) are also present in the layer structure 15. The electrical connecting lines can be composed of aluminum.

Each electrical terminal 3 and 4 has a housing 12 that is set in place over the layer structure 15. The housing 12 can be composed of plastic and can be an injection-molded part. A protective diode 13 that is connected parallel to the individual chains of series-connected solar cells within the solar module 1 in order to limit the dark state power loss in the solar cells is located inside the housing 12. A respective protective diode 13 is located at each electrical terminal 3 and 4 at which is the most simple location with respect to the electrical connecting lines within the solar module 1. Only a single shunt line is thereby required, whereas shunt lines in a plurality of planes having appropriate, mutual insulating devices would be required at the respective most simple locations without this provision of the protective diodes 13.

A solar cell 18 may be seen in the schematic illustration of FIG. 2. The electrical lines 16 and 17 extend, in part, on the rear side of the solar cell. The electrical line 24 extends, in part, on the front side of the solar cell 18. The protective diode 13 is connected between the two lines 16 and 17. The conductor 5 is secured to the line 16 at a solder point 21 within a cut out 20 in the rear side foil of the solar modules 1. A part of the conductor 5 between the solder point 21 and a point 22 within the housing 12 is executed as a flexible line 19 in order to make it easy to put the housing 12 in place. The point 22 within the housing 12 serves the purpose of strain relief for the conductor 5.

A protective diode 13 can be arranged in each housing 12. When, for example, a solar module 1 comprises 36 solar cells, then a respective protective diode 13 can be provided in a housing 12 for each 18 solar cells. When fewer than approximately 24 solar cells are connected between the two electrical terminals 3 and 4, a single protective diode 13 in a housing per solar module 1 also suffices.

Figure 3:
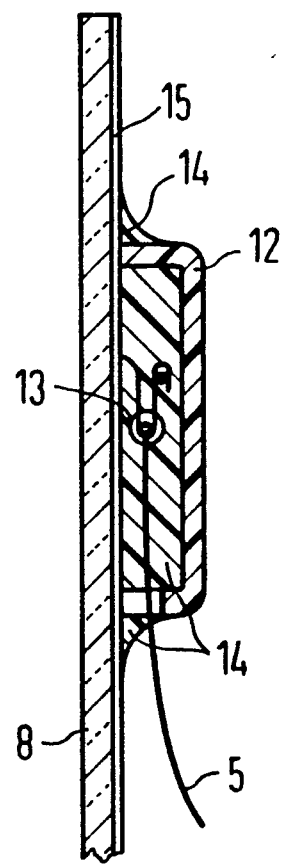
FIG. 3 is a sectional view illustrating the structure of an electrical terminal of such a solar module.

FIG. 3 is a cross-sectional view through a portion of the solar module of FIG. 2. The housing 12 has its inside filled with silicone 14 and is glued to the rear side of the solar module 1 at the location of the respective electrical terminal 3 or 4. Silicone Q3-3744 R.T.V. of the Dow Corning Company is preferably employed as a casting compound 14 and as an adhesive. The silicone 14 is preferably also applied at the outer edge of the housing 12 at the point of transition to the layer structure 15.

The electrical terminals 3 and 4 can be attached to the rear side of the solar module 1 such that, given the employment of plugs instead of the conductor connectors 5, solar modules 1 that lie immediately next to one another, can be directly plugged to one another. The plugs can thereby have such tolerances that they can compensate thermal expansions. Water-tight concentric plug and socket connectors can thereby be employed as plugs.

Figure 4:
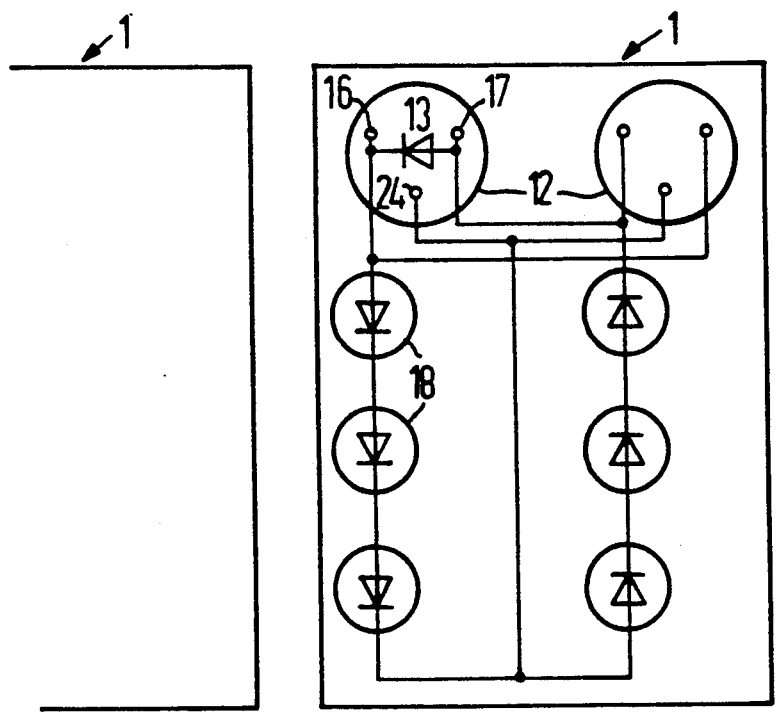
FIG. 4 is an equivalent circuit diagram for a solar module according to the invention.

FIG. 4 is a simplified illustration of the invention in combination with an equivalent circuit diagram. FIG. 4 shows a solar module 1 of the invention on which six solar cells 18 are mounted which are connected in series. The arrangement of the solar cells 18 relative to each other on the module on the glass plate is arbitrarily selected and represents only one possible arrangement. The two electrical terminals for the solar module 1 are respectively mounted in a first housing 12 shown at the upper left of FIG. 4 with the two electrical conductors 16 and 17 being respectively connected to one of the series connected solar cells 18. The two terminals 16 and 17 are bridged with a protective diode 13. The third electrical conductor 24 shown in FIG. 4 corresponds to the conductor 24 shown in FIG. 2 and is not critical to the invention, but enables a further arrangement of the protective diode 13 so as to bridge only part of the solar cells 18. Thus, the protective diode 13 can be connected between terminal 24 and terminal 16 or between terminal 24 and the terminal 17. The second electrical terminal for the module is formed in a second housing 12 which is shown in the upper right of FIG. 4 to the right of the first housing 12. At least one electrical conductor that is connected to one end of the solar cell chain terminates in the second housing 12 in the upper right of the FIG. Three electrical conductors are shown in this housing also so that an arrangement such as shown in the left housing 12 can be provided with a protective diode.

For electrically interconnecting two of the solar modules 1, the chains on the solar modules 1 are connected in series such that one end of the chain on one module is connected to the starting end of the chain of the second solar module. Thus, the electrical terminal between modules occurs only at one of the possible terminal points 16 or 7 within a housing 12 which is the one that has the correct polarity for a series interconnection.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A laminated solar module, comprising, a glass plate having a front side and a back side, and first and second opposite edges, a plurality of series connected solar cells connected to form a laminated solar module mounted on the back side of said glass plate and secured thereto with hot-melt adhesive foil and which form a layer structure, first and second electrical terminals for said series-connected solar cells which are arranged so as to be spatially remote from each other on the back side of said solar module on the top of the layer structure adjacent said first and second opposite edges, first and second hollow housings mounted to cover said first and second electrical terminals, a protective diode in at least one of said first and second hollow housing which is connected across a plurality of said solar cells and which becomes non-conductive when sunlight impinges on said solar cells; and silicone compound which fills said first and second hollow housing and which bonds the housings to the back side of said laminated solar module.

2. The module of claim 1, and further comprising: plug connectors for connecting said module to an adjacent like module.

3. The module of claim 2, also further comprising: shrink fit tubing covering respective ones of said connectors.

4. A solar module arrangement comprising: a plurality of glass plates which have a front side and a rear side; a plurality of solar modules with each one mounted on one of said plurality of glass plates and having first and second opposed edges, said modules and glass plates aligned such that a first edge of a module and a glass plate is mounted adjacent a second edge of an adjacent module and glass plate, first and second electrical terminals for each module located adjacent a respective edge and spaced from each other, a plurality of solar cells connected in series between said first and second electrical terminals and attached to the rear side of said glass plate by hot melt adhesive foil, and which form a layer structure, said first and second electrical terminals located at respective end ones of said plurality of said series-connected solar cells and extending from said rear side of said glass plate; at least one protective diode in said first terminal, flexible electrical conductors extending from a first to a second electrical terminal, and a strain relief device holding said flexible conductors, a plurality of hollow housings covering each of said first and second electrical terminals and a portion of said flexible conductor, said protective diode and said strain relief device; and a casting compound which fills said hollow housings and bonds said electrical connections to said rear side of said glass plate, whereby the first edge of a module is arranged next to the second edge of a neighboring module; whereby the electrical connections respectively connect an electrical terminal of one solar module to the closest terminal of the neighboring solar module; and whereby each of the electrical connections comprises at least one flexible conductor and a strain-relief means.

* * * * *